United States Patent [19]

Smith, III et al.

[11] 4,359,222

[45] Nov. 16, 1982

[54] HAND-HELD ELECTRONIC GAME PLAYING DEVICE WITH REPLACEABLE CARTRIDGES

[75] Inventors: Jay Smith, III, Pacific Palisades; Gerald S. Karr, Venice; Lawrence T. Jones, Playa Del Rey, all of Calif.

[73] Assignee: Smith Engineering, Santa Monica, Calif.

[21] Appl. No.: 955,781

[22] Filed: Oct. 30, 1978

[51] Int. Cl.³ .................. A63B 71/04; A63F 9/14
[52] U.S. Cl. .................. 273/85 G; 273/86 R; 340/365 VL; 340/711; 340/725; 340/706; 340/784; 340/815.06; 340/286 M
[58] Field of Search ............... 35/8 R, 8 A; 273/1 E, 273/85 G, 86 R, 86 B, 88, 94, 237, DIG. 28; 340/716–719, 798, 365 VL, 378.3, 286 M

[56] References Cited

U.S. PATENT DOCUMENTS

| | | | |
|---|---|---|---|
| 3,095,373 | 7/1975 | Freiser | 350/160 LC |
| 3,654,392 | 4/1972 | Beinhocker et al. | 273/237 |
| 3,659,284 | 4/1972 | Rusch | 273/85 G |
| 3,723,749 | 3/1973 | Shapiro | 307/38 |
| 3,787,834 | 1/1974 | Elliot | 350/160 LC |
| 3,807,831 | 4/1974 | Soref | 350/160 LC |
| 3,868,674 | 2/1975 | Lorteije | 350/160 LC |
| 3,874,669 | 4/1975 | Ariano et al. | 273/85 G |
| 3,878,537 | 4/1975 | Roncillat et al. | 350/160 LC |
| 3,888,491 | 6/1975 | Bernard et al. | 273/237 |
| 3,895,372 | 7/1975 | Kaji et al. | 350/160 LC |
| 3,898,646 | 8/1975 | Washizuka et al. | 350/160 LC |
| 3,902,169 | 8/1975 | Washizuka | 350/160 LC |
| 3,903,518 | 9/1975 | Hatsukano | 350/160 LC |
| 3,911,426 | 10/1975 | Mouton | 350/160 LC |
| 3,921,162 | 11/1975 | Fukai et al. | 350/160 LC |
| 3,923,306 | 12/1975 | Cahn-Hidalgo | 273/237 |
| 3,955,190 | 5/1976 | Teraishi | 350/160 P |
| 3,956,745 | 5/1976 | Ellis | 340/365 VL |
| 3,972,040 | 7/1976 | Hilsum et al. | 315/169 TV |
| 3,978,328 | 8/1976 | Fabry et al. | 340/365 X |
| 4,037,931 | 7/1977 | Ido | 350/160 LC |
| 4,092,527 | 5/1978 | Luecke | 364/709 |
| 4,095,791 | 6/1978 | Smith et al. | 273/85 G |
| 4,107,784 | 8/1978 | Van Bemmelen | 364/900 |
| 4,114,890 | 9/1978 | Yamamoto | 273/237 |
| 4,142,180 | 2/1979 | Burson | 273/85 G |
| 4,149,027 | 4/1979 | Asher et al. | 273/DIG. 28 |
| 4,156,928 | 5/1979 | Inose et al. | 273/237 |
| 4,162,792 | 7/1979 | Chang et al. | 273/85 G |
| 4,279,021 | 7/1981 | See et al. | 364/900 |

FOREIGN PATENT DOCUMENTS

7414327  5/1976  Netherlands ................ 273/85 G

*Primary Examiner*—Richard C. Pinkham
*Assistant Examiner*—Scott L. Brown
*Attorney, Agent, or Firm*—Jackson, Jones & Price

[57] ABSTRACT

A hand-held electronic program playing device having a flat panel electro-optical display unit incorporated in a housing, is disclosed. Circuitry suitable for driving the display unit and manually operable controls for providing a plurality of control functions are incorporated in the housing. A replaceable cartridge unit which fits into and mates with the housing incorporates a microprocessor and supplementary circuitry. The cartridge unit can include a transparent overlay which incorporates one or more graphic patterns. When the cartridge is placed into the housing the overlay is disposed relative to the display unit so that the visual image of the display unit is viewed through the overlay. The microprocessor and overlay in the replaceably cartridge define the program such as a game that can be played by the housing and cartridge combination.

33 Claims, 10 Drawing Figures

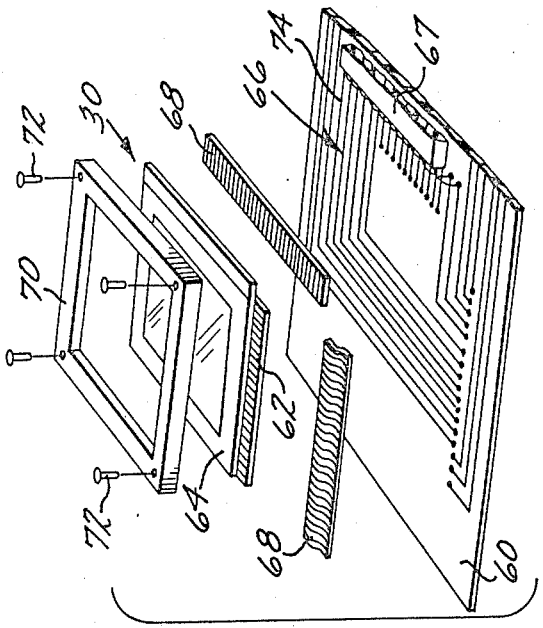
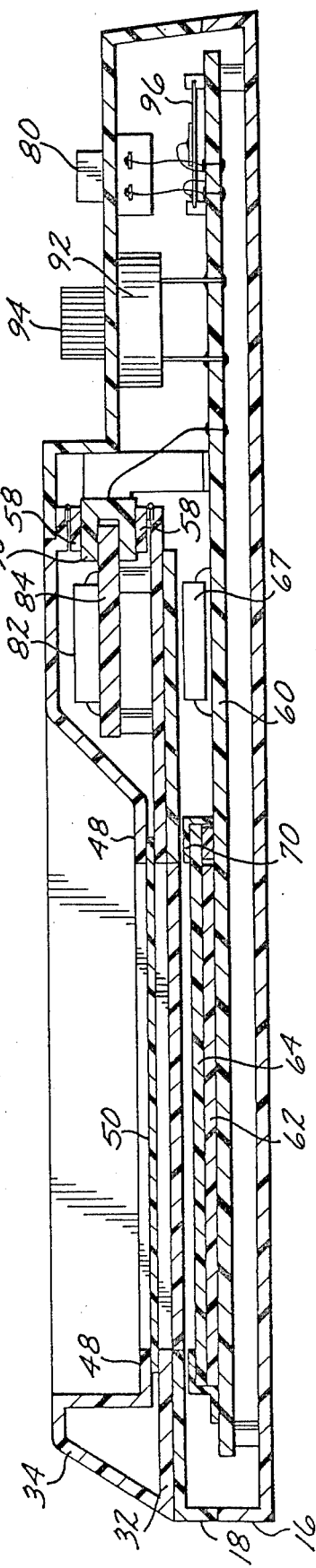

HAND-HELD ELECTRONIC GAME PLAYING DEVICE WITH REPLACEABLE CARTRIDGES

BACKGROUND OF THE INVENTION

1. Field of the Invention

The present invention relates to a hand-held electronic game playing device and more particularly to a hand-held electronic game playing device having a screen and controls for manipulating symbols or objects displayed on the screen.

2. Description of the Prior Art

Electronic game devices such as are attachable to television sets are well known. Some of these devices provide the user a choice of games that can be played. These devices utilize read only memories which contain the programing for one or more games. The game to be played at any particular time is selected by a control element on the control console. Control elements such as knobs and corresponding circuitry is included in the control console to enable a player to make subjectively determined responses to situations objectively determined by the memory circuitry provided in the device.

The visual display for these electronic games is a household television set. For a further description of the state of the art related to television gaming devices reference is made to U.S. Pat. Nos. 3,728,480; 3,659,284; 3,659,285; 3,421,161 and Re. 28,507.

In addition to the television-connected electronic game devices, smaller hand-held electronic game playing devices have also been developed. The hand-held devices of the prior art usually contain within the same housing a memory defining a game, control elements, a display device such as a light emitting diode (L.E.D.) type display and display driver circuitry. The driver circuitry transmits signals to the display which are subjectively determined by a player within the pre-set confines of the game.

Examples of games which have gained popularity in the past include a Ping-Pong game, a baseball game, and a car racing game. Characteristic of each of these games is the fact that a predetermined movable and moving symbol, as for example a ball or a racing car appears on the display unit and undergoes a predetermined path of motion which can be altered by a player by manipulating the control elements. In the Ping-Pong game, for example, the player manipulates paddles which bounce a ball. In the car racing game, for example, the player, by manipulating the controls steers the car along a predetermined track and may also be able to change its speed.

The number of games which may be realized on microprocessor driven display devices are practically limitless. As the microprocessor and electronic miniaturization technology advances, the capability of designing games of ever increasing sophistication continues to grow. However, the limitation that a certain amount of memory must be allocated for defining a game will continue to exist. For the present, hand-held electronic game devices are capable of playing only one game. Only large console devices that need to be connected to television sets have the capability of providing at least a limited selection of games to the user.

SUMMARY OF THE INVENTION

It is an object of the present invention to provide an electronic game utilizing a visual screen-type display which is compact, light weight, economical to manufacture, and is completely hand-held.

It is another object of the present invention to provide a hand-held electronic game playing device having a visual display wherein the game may be subjectively selected at the option of a player, simply by changing the game cartridge.

These and other objects and advantages are attained by the electronic program playing device described in this invention as follows. A flat panel information display unit is mounted within a compact housing. Cartridge units which may have a substantially transparent overlay can be removably mounted to the housing. The cartridge unit includes a microprocessor having a preset memory and appropriate circuitry for connection to the circuitry of the housing. The memory of the microprocessor defines the program. A driver circuitry suitable for transmitting signals to the flat panel information display unit is incorporated in the housing. The driver circuitry is operatively connected to the microprocessor and to a plurality of control circuits which terminate in manually operable control knobs provided in the housing. The substantially transparent overlay contains a predetermined, permanently affixed graphic pattern such as for example a race track. When the cartridge is inserted into the housing, the overlay is disposed in a spatial relationship relative to the display unit wherein the display unit and the transparent overlay provide a unitary visual image.

As a program such as a game is played, the microprocessor, in conjunction with its memory, transmits appropriate signals to the driver circuitry to cause a predetermined visual symbol to appear on the display unit. As a player manipulates at least one of the controls, the microprocessor transmits appropriate signals through the driver circuitry to result in corresponding alterations in the visual symbol appearing on the display unit. The visual image on the display unit is viewed through the graphic pattern provided on the transparent overlay. A limitless number of cartridges, each having a different microprocessor and transparent overlay, can thus be provided for use in the base control housing.

The objects and features of the present invention are set forth with particularity in the appended claims. The present invention may be best understood by reference to the following description, taken in connection with the accompanying drawings in which like numerals indicate like parts throughout the figures thereof.

BRIEF DESCRIPTION OF THE DRAWINGS

FIG. 4 is an exploded perspective view of the cartridge unit of the present invention;

FIG. 5 is an exploded perspective view of a liquid crystal display assembly of the present invention;

FIG. 6 is a cross sectional view of the hand-held game of the present invention, with the cartridge inserted into the housing unit, the cross section being taken at lines 6—6 of FIG. 1;

FIG. 7 is an end view of the hand-held game of the present invention with the cartridge inserted into the housing unit;

DESCRIPTION OF THE PREFERRED EMBODIMENT

The following specification taken in conjunction with the drawings sets forth the preferred embodiments of the present invention in such a manner that any person skilled in the art can use the present invention. The embodiments of the invention disclosed herein are the best modes contemplated by the inventors for carrying out their invention in a commercial environment, although it should be understood that various modifications can be accomplished within the parameters of the present invention.

Figure 1:
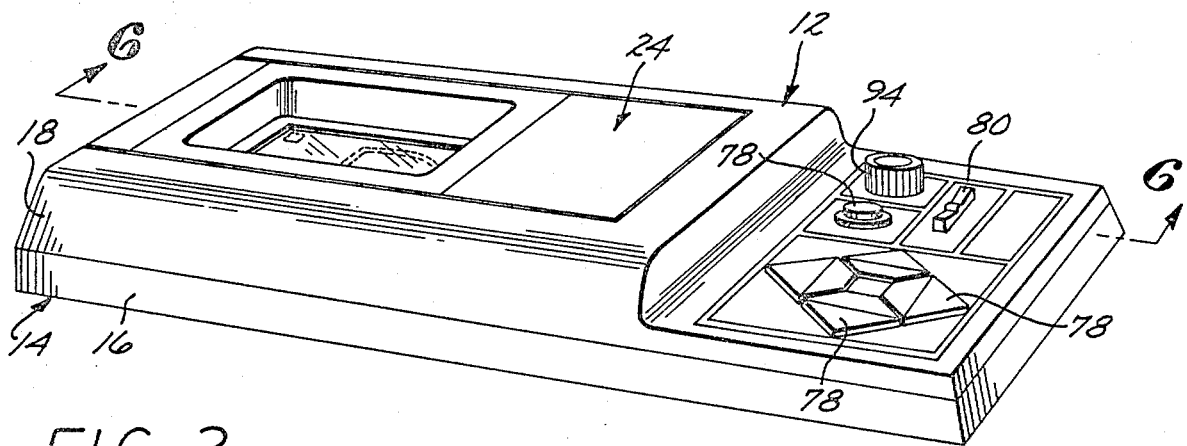
FIG. 1 is a perspective view of a specific embodiment of the present invention showing a cartridge unit inserted into a housing unit.
Figure 2:
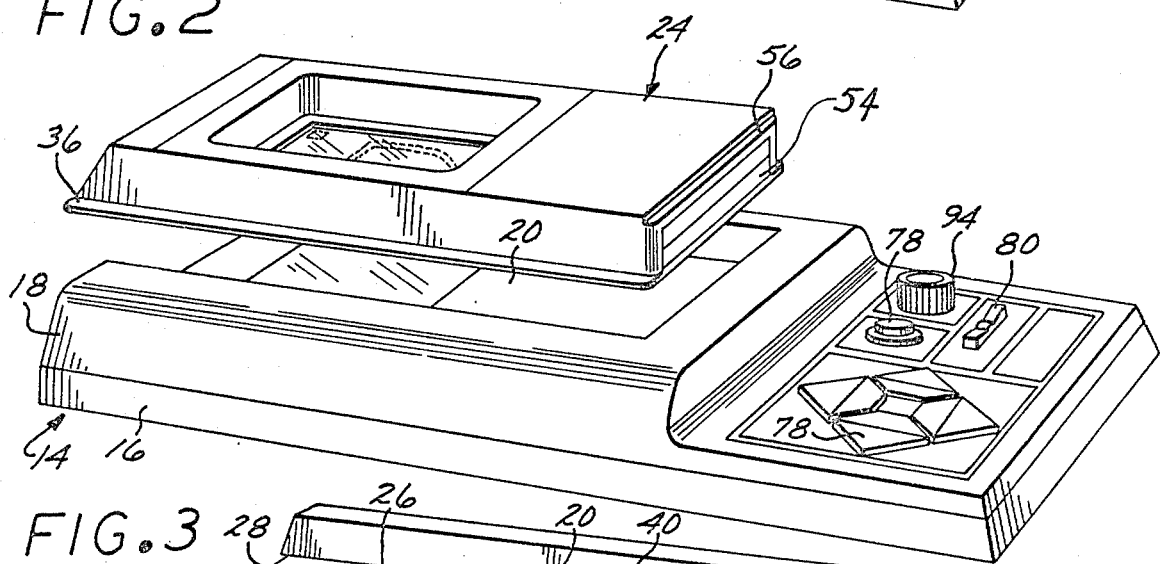
FIG. 2 is a perspective view of the specific embodiment of the present invention showing the two basic elements of the hand-held game of the present invention, the cartridge unit and housing unit in spatial relation.
Figure 3:
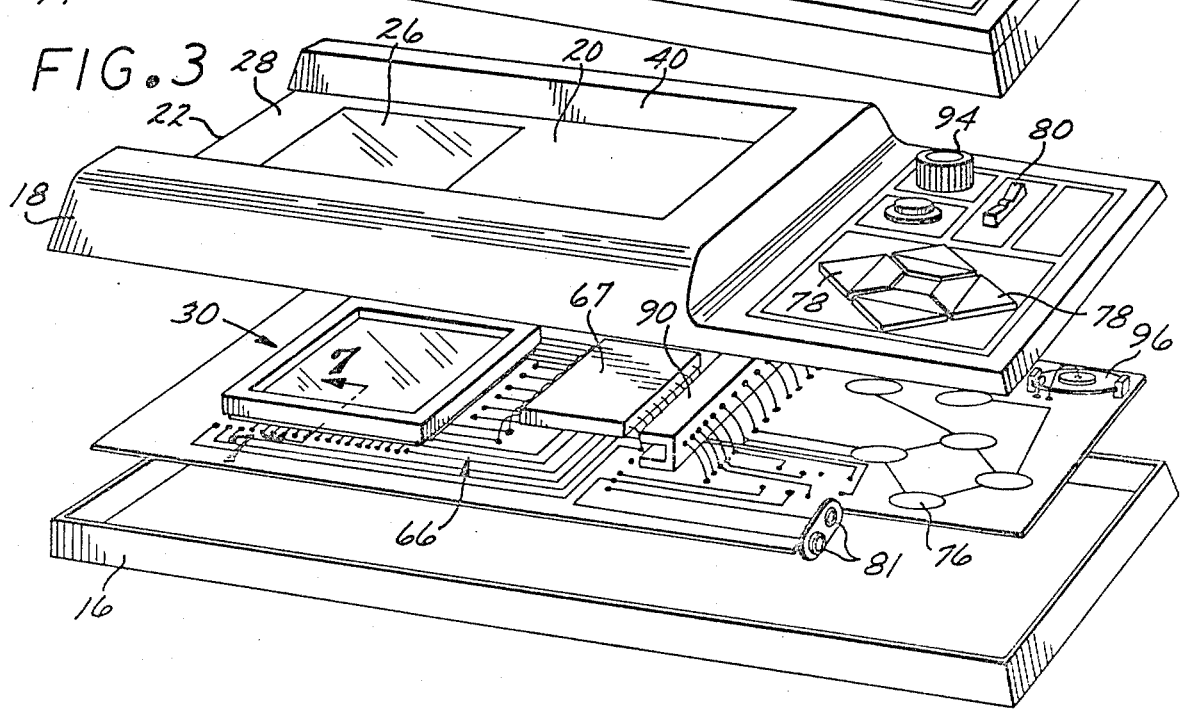
FIG. 3 is an exploded perspective view of the housing unit of the present invention.

Reference is now made to the drawings and particularly to FIGS. 1, 2, 3 and to the cross sectional view of FIG. 6 for a detailed description of the hand-held, compact electronic game playing device 12 of the present invention. A generally rectangularly shaped base unit or housing 14 comprises a hollow lower housing shell 16 and an upper housing shell 18. The lower housing 16 and upper housing 18 may be conveniently manufactured by molding suitable plastic material. The two housing shells 16 and 18 may be snap or friction fitted together. Alternatively, they may be fastened to one another by suitable fasteners, such as screws (not shown).

The upper housing shell 18 incorporates an upwardly open channel or trough 20 best shown in FIG. 3. The channel or trough 20 has a substantially U shaped cross section and it terminates at a shorter side 22 of the substantially rectangular upper housing shell 18. As will be described below in further detail, the purpose of the channel or trough 20 is to accomodate a cartridge unit 24, best shown in FIG. 2.

A substantially square shaped opening 26 (FIG. 3) is provided in a bottom wall 28 of the channel or trough 20 of upper housing 18. The opening 26 serves to accomodate a flat panel information display unit such as a liquid crystal display unit 30. As will be readily understood from the ensuing description, the electronic games which may be played on the game playing device 12 of the present invention are visualized on the liquid crystal display unit 30.

Referring now particularly to FIGS. 2 and 4, the cartridge unit 24 of the preferred embodiment of the game playing device 12 of the present invention will be described. The cartridge unit 24 has a substantially flat lower housing panel 32 and a matching dimensioned hollow upper housing member 34. The lower housing panel 32 and upper housing member 34 may be conveniently manufactured from the same molded plastic material as the base unit 14, and may be snap or friction fitted together. Alternatively, they may be fastened to one another by suitable fasteners such as screws (not shown).

The entire cartridge unit 24 is dimensioned to be slideably attachable within the channel or trough 20 provided in the base unit 14. In order to accomplish the mounting of the cartridge unit 24 within the channel 20 of the base unit 14, the lower housing panel 32 is provided with laterally extending flanges or ears 36 shown in FIGS. 2 and 7. The flanges 36 are located on the two parallel longer sides 38 of the cartridge unit 24 which abut the substantially vertically disposed walls 40 of the channel 20. Each wall 40, shown in FIG. 3, which is disposed substantially parallel to the general longitudinal axis of the base unit 14, incorporates a channel or groove 42 shown in FIG. 7. The grooves 42 are dimensioned to slideably receive and to hold by friction the matching aligned ears 36 of the lower housing panel 32.

Referring again to FIGS. 1, 2 and particularly to the exploded view of FIG. 4, openings or cut-out portions provided both in the lower housing panel 32 and in the upper housing members 34 of the cartridge unit 24 are seen. Both the opening 44 in the lower housing panel 32 and the opening 46 in the upper housing member 34 generally match the substantially rectangular shape of the liquid crystal display unit 30. In the assembled game playing device 12, these openings are aligned with the display unit 30 as well as with one another. A flange 48 surrounding the opening 46 is provided in the upper housing member 34 to hold between the lower housing panel 32 and the upper housing member 34 a substantially flat overlay or panel 50.

In the preferred embodiment described here the overlay or panel 50 is composed of substantially transparent plastic material and has a graphic pattern or sketch 52 permanently affixed thereto. Alternatively, the overlay member 50 may be of a suitable glass composition. It is readily apparent from the above that the game visually displayed on the liquid crystal display unit 30 is viewed by a player through the overlay 50. Therefore the permanently affixed graphic pattern or sketch 52 contributes to the overall visual effect to the player. Alternatively, the overlay 50 may be omitted and a graphic peripherial opening (not shown) may simply define the field of the display, depending on the nature of the cartridge function.

In order to provide for protection of the electronic components contained within the cartridge unit 24 and to enable operative connection to the electronic components located within the base unit 14 a hinged door 54 is provided in the cartridge 24. The hinged door 54 is located on a shorter side 56 of the cartridge unit 24. As the cartridge unit 24 is assembled to the base unit 14, two sections 58 of the hinged door 54 which are respectively assembled to the lower housing panel 32 and the upper housing member 34, fold. The sections 58 of the door 54 are shown in a folded position in the cross sectional view of FIG. 6. Electric contact between a plurality of terminals provided in both the base unit 14 and the cartridge unit 24 is then established.

It should be understood that although a particular and preferred geometrical and mechanical arrangement for the structure and attachment of the base 14 and cartridge unit 24 is disclosed here, the scope of the present invention is not intended to be limited thereby. Alternative arrangements which accomplish the purpose of having a replaceable cartridge unit and the juxtaposition of the overlay 50 to the display unit 30 for viewing the latter two in unison, may be readily apparent to those skilled in the art. Therefore, such alternative arrangements are intended to be included in the scope of the present invention.

Having described the housing and general outside appearance of electronic game playing device 12 of the present invention, its actual mode of operation, further structure and various further features and advantages are set forth in the ensuing description.

Referring now to FIG. 5, the liquid crystal display unit 30 is mounted upon a substantially flat panel 60 which is contained within the base unit 14. It is to be noted that while in the ensuing description only liquid crystal type display units are discussed, the present invention may also be practiced by using other electro-optical information display members such as a light emitting diode type display unit. However, chiefly due to its lower power consumption, a liquid crystal type display unit is actually preferred.

Even though liquid crystal display devices and appropriate addressing circuitry are well known in the art, for the purpose of explaining the nature of the present invention, the principal mode of operation of such devices is very briefly described here.

A typical liquid crystal unit such as the one which may be utilized in the present invention, comprises two transparent, orthogonally polarized glass panels. These are assembled parallel to one another in a substantially overlapping configuration. A gap typically having a width of approximately 12 microns, disposed between the parallel located polarized glass panels, is filled with a suitable liquid crystal composition. An important characteristic of a liquid crystal composition is that when a voltage exceeding a certain threshold value is applied to a portion of the composition, the optical characteristics are changed in that portion of the composition. This change in characteristics results in a visually perceivable change in the appearance of the composition, when viewed through the polarized glass unit.

In typical liquid crystal display units such as for example the ones described in the U.S. Pat. Nos. 3,921,162 and 3,895,373, the layer of liquid crystal composition is disposed in an electrically conductive matrix arranged in the form of rows and columns. As a result, a voltage required to change the optical characteristics of the composition, may be selectively applied at any given point of intersection of the rows and columns.

In the liquid crystal display units of the present invention, as in many prior art devices, the matrix comprises electrically conductive layers deposited respectively in the forms of rows and columns in the polarized glass panels. In the preferred embodiment disclosed here, the matrix comprises 16 rows and 16 columns.

The structure of the liquid crystal display unit utilized in the preferred embodiment of the present invention is schematically illustrated in the exploded perspective view of FIG. 5. A layer of suitable liquid crystal composition (not shown) is disposed between a polarized lower glass panel 62 and a polarized upper glass panel 64. Columns of the matrix of invisible electrically conductive layers are present in the surface of the lower glass panel 62 which faces the liquid crystal layer. Rows (not shown) of like layers of electrically conductive material are likewise located on the surface of the upper glass panel 64, so as to abut the liquid crystal layer. It is to be noted that in alternative embodiments of the device of the present invention the upper glass panel 64 need not be polarized as the transparent overlay 50 may be polarized in its stead.

The rows and columns (not shown) are electrically connected to corresponding terminals of a printed addressing or driving circuit, schematically shown as 66 on FIGS. 3 and 4. The connection is accomplished through substantially elastic members 68 which have alternating strips of electrically conductive and nonconductive material. Such members are commonly referred to in the art as zebras. Other means of connecting the electrically conductive rows and columns to the printed circuit board may also be utilized. The liquid crystal display unit 30 is securely held in place by a plastic frame 70 which is secured to the flat planel 60 by suitable screws or rivets 72.

The addressing or driving circuitry 66, which in the present invention contains no memory, may be readily designed according to standard practices in the art. The addressing circuitry 66 includes, in addition to printed circuits 74, a chip 67. For the description of the state of the art relating in general to liquid crystal display devices and suitable addressing circuitry, reference should be made to U.S. Pat. Nos. 4,037,931; 3,898,646; 3,902,169; 3,903,518; 3,911,426; 3,654,606; 3,723,749; 3,787,834; 3,807,831; 3,878,537; 3,868,674; 3,955,190; 3,972,040; 3,895,372; 3,895,373 and 3,921,162 which are hereby expressly incorporated by reference.

The present invention may be readily practiced with state-of-the-art addressing circuitry. However, an addressing circuitry particularly suitable for application in the electronic game playing device of the present invention is described in copending application entitled "Liquid Crystal Display Games", Ser. No. 965,961 which is assigned to the same assignee as the present application.

The addressing circuitry 66 is connected to a plurality of control devices 76 which are symbolically shown in FIG. 3. The control devices 76 terminate in a plurality of control knobs or buttons 78 which are located on the outside of the upper housing shell 18. The function of the control knobs or buttons is described below to the extent not readily apparent. An on-and-off switch 80 is included in the housing. In an alternative embodiment a single control circuit and consequently a single control knob may be sufficient. In that case however, the device 12 may not be able to play certain games which require simultaneous manipulation of at least two controls. As can be appreciated by a person skilled in this field, the controls or control means can be alternatively mounted on the cartridge unit 24 or the control means can be mounted on both the housing shell 18 and the cartridge unit 24. For example, some games may require additional controls that can be advantageously mounted on the cartridge for maximum play option.

A plurality of suitable contact elements 81 are affixed to the flat panel 60. These are adapted for contacting terminals of a plurality of batteries (not shown). Referring now to the exploded view of FIG. 4, a microprocessor containing a microcomputer or chip 82 having a preloaded read only memory is disclosed. The function and design of microcomputers in general is adequately disclosed in the prior art, and therefore need not be described here in detail. The microprocessor such as a Model 8021 sold by Intel Corporation, Sunnyvale, California contains a predetermined program to send electric signals through the addressing circuitry. These signals cause the appearance and movement of predetermined visual symbols on the display unit 30. In addition, the microprocessor 82 is programmed to respond in a predetermined manner to a plurality of situations which arise as a result of a player subjectively manipulating the controls 76.

As an illustrative example, the microprocessor may be programmed to bounce a symbol corresponding to a ball at an angle which is determined by an angle of a paddle hitting the ball. The angle at which the ball is hit by the paddle is, in turn, partly determined by the player who manipulates one of the controls 76 causing a lateral movement of the paddle across the display unit 30. Thus the microprocessor 82 contains the information necessary to play a certain predetermined game.

As it has been briefly mentioned above, the overlay 50 which contains the graphic pattern 52 thereon, significantly coacts with the display unit 30 to provide a visual image of the game. As an example, the graphic symbol 52 may depict a race track. In this case, the microprocessor 82 is programmed with information to provide a car racing game. The microprocessor 82 may cause a symbol corresponding to a car to move across the display unit 30 at a predetermined speed. The player is then required to manipulate the controls to keep the racing car on the track. The microprocessor 82 may be additionally programmed to keep and cause the display of a score, to limit the duration of a game and to perform other readily apparent functions.

It is to be understood that the above referred to games, such as a bouncing ball game or a car racing game are intended to serve as examples rather than limitations. In fact, any game selected from a practically limitless number of games may be programmed into the microprocessor 82. A significant advantage provided by the novel electronic display device 12 of the present invention is that the user may choose from the many cartridge units that are provided. Each cartridge unit incorporates a microprocessor 82 programmed to define a different game and includes a matching overlay 50 having a graphic pattern corresponding to the game defined by the microprocessor.

It should also be understood that the microprocessor may contain a predetermined program which defines something other than a game, as the word game is understood in the conventional sense. For example the microprocessor may have a program defining arithmetic puzzles, or it may even store sufficient information to serve as a calculator. It is readily apparent that the device 12 of the present invention may be used for such purposes as well.

The microprocessor 82 is fixedly attached to a printed circuit board 84. The printed circuit board 84, in turn is fixedly attached by suitable fasteners such as rivits or screws 86 to the lower housing panel 32 of the cartridge unit 24, as it is shown in FIG. 4.

Electrical connection between the cartridge unit 24 and the base unit 14 is established by sliding an end 88 of the printed circuit board 84 into a U-shaped member 90 best shown in FIGS. 3 and 6. The U-shaped member 90 is affixed to the flat panel 60 in the base unit 14. The end 88 of the printed circuit board 84 and the U-shaped member 90 respectively contain a plurality of matching, aligned contact terminals. It will be readily apparent to those skilled in the electronics arts that other equivalent structures may be utilized for providing electrical connection between the cartridges 24 and base units 14. Consequently, such equivalent structures are within the scope of the present invention.

Referring now to FIGS. 1, 2 and 3 an illustrative example of the topographical array of the control knobs or buttons 78 on the upper housing shell 18, is shown. Alternative topographical arrangement of the control knobs 78 is, of course possible. Accordingly, alternative arrays of the control knobs are intended to be fully included in the scope of the present invention.

The control devices 76 may be designed according to standard practice in the present state of the electronic arts. They include one continuously variable, i.e., analog type control, having a potentiometer 92 shown on FIG. 6, and terminating in control knob 94. The additional controls serve not only to further enable a player to manually control the visual display of a moving symbol, but also for resetting the game to a starting state or for sending a command to display the score, etc.

A suitable sound producing device, usually referred to in the art as a bender 96 is attached to the flat panel 60. The top circuitry including the microprocessor 82 is programmed to actuate the bender 96 whenever a predetermined event, such as a ball bouncing off a surface, occurs in the game.

Figure 8:
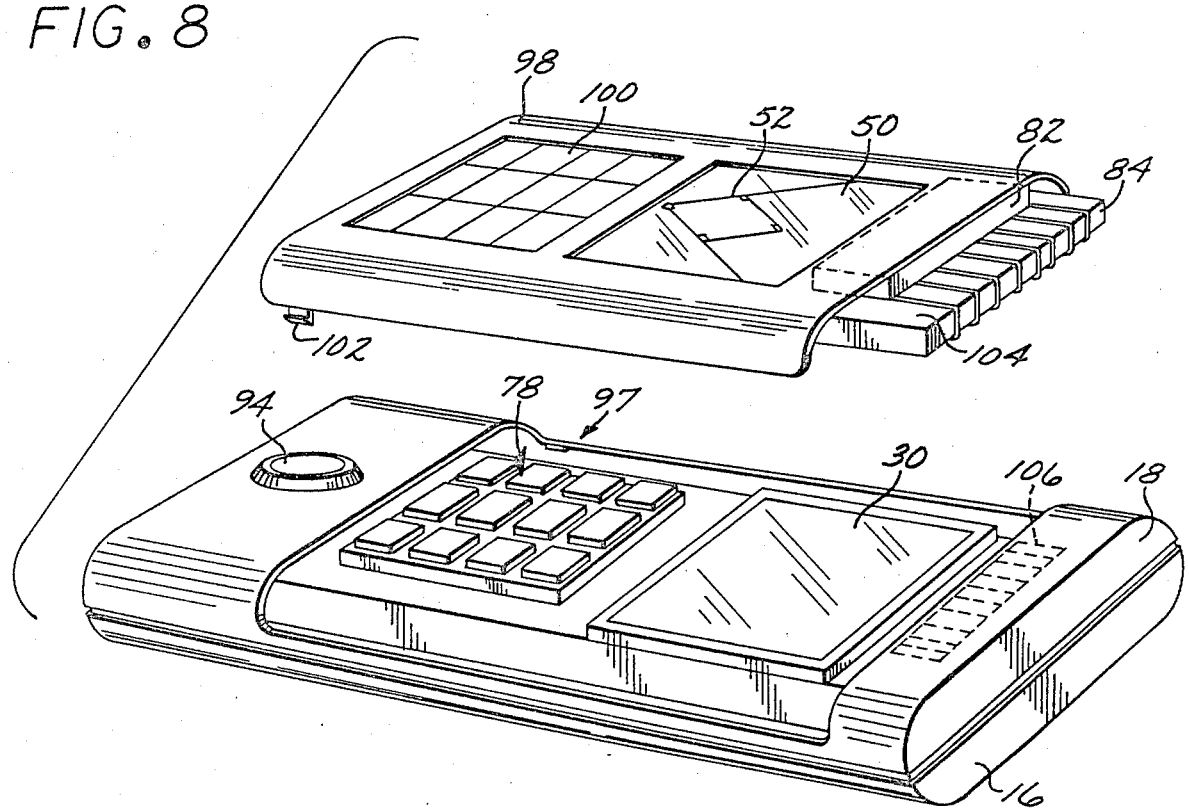
FIG. 8 is a partially exploded perspective view of a second specific embodiment of the present invention.
Figure 9:
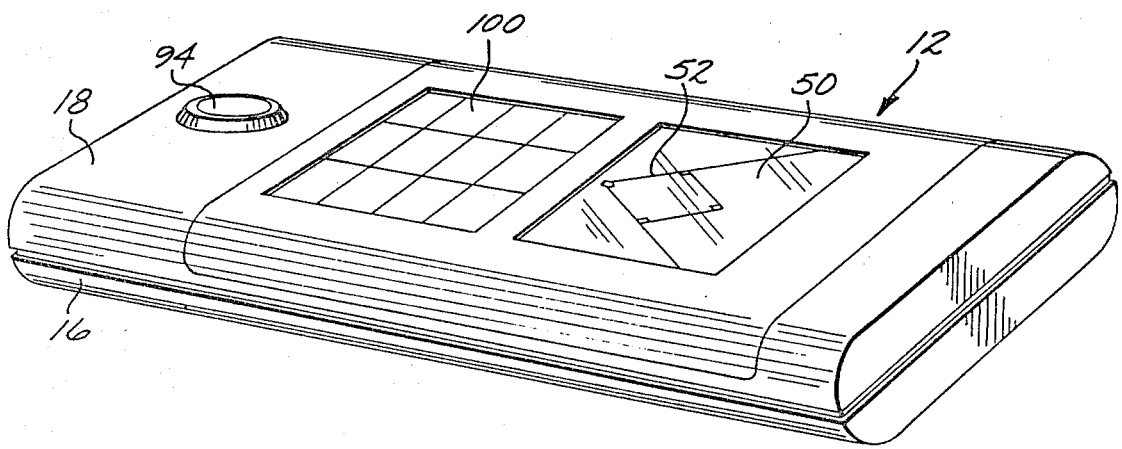
FIG. 9 is a perspective view of the second specific embodiment of the present invention.

Referring now to FIGS. 8 and 9 a second specific embodiment of the present invention is shown. In the second specific embodiment as in the first specific embodiment, a liquid crystal display unit 30, an addressing circuitry 66 and control devices 76 are located in a housing 14. The housing 14, as in the above described first specific embodiment, comprises a lower housing shell 16 and an upper housing shell 18. The upper housing shell 18 has a relatively large cut-away portion 97 through which a plurality of control knobs or buttons 78 and the liquid crystal display unit 30 are exposed when a cartridge unit 24 is not attached to the housing 14.

In the second specific embodiment of the present invention the control knobs or buttons 78 are laid out in the shape of the control knobs of most commercially available hand-held electronic calculators, i.e. the control knobs 78 are arranged in rows and columns. A continuously variable control knob 94 is mounted to the upper housing shell 18 itself, as shown in FIGS. 8 and 9.

The cartridge unit 24 of the second specific embodiment of the present invention, like the cartridge unit of the first specific embodiment, incorporates a microprocessor 82, printed circuit board 84, and a transparent overlay member 50. This cartridge unit 24, however, comprises basically only one housing panel 98 to which the several component parts of the cartridge unit 24 are mounted.

The transparent overlay member 50 has a permanently affixed pattern 52. It is located over the liquid crystal display unit 30 in the assembled device 12, as shown in FIG. 9. In addition, the cartridge unit 24 of the second specific embodiment also incorporates a flexible transparent member 100 which is mounted in a substantially square shaped, cut out portion of the cartridge unit. The flexible transparent member 100 is disposed over the control knobs 78 in the assembled device 12. The control knobs 78 may be individually actuated by a player by pressing down through the transparent member 100.

As it was pointed out above, each cartridge unit 24 provides a different game to be played on the device 12 and the control knobs 78 may have different functions in each game. Therefore the flexible transparent member 100 may have various symbols affixed thereto, in effect explaining to the player the specific function of a control knob in the specific game defined by the cartridge 24. In alternative embodiments instead of the flexible transparent member a template member may be provided. The template member comprises a part of the cartridge and therefore is adapted to be used in connection with the program defined by the cartridge. It may simply cover those control knobs which are not required to actuate the program defined by the cartridge. The necessary control knobs, on the other hand, are accessible to a player through properly aligned holes provided in the template member.

In the second specific embodiment shown in FIGS. 8 and 9 the entire cartridge unit 24 is configured to cover the cut away portion 97 of the housing unit 14. Attachment of the cartridge unit 24 to the housing 14 is accomplished by snap fitting a pair of prongs 102 (only one of which is shown in FIG. 8) to the housing 14. Electrical connection is established between the cartridge unit 24 and the housing 14 by sliding a protruding portion 104 of the printed circuit board 84 under matching aligned contact elements 106 provided in the inside surface of the upper housing shell 18. Insertion of the protruding portion 104 into the housing 14 not only provides electrical contact, but also contributes to the physical attachment of the cartridge 24 to the housing 14.

Figure 10:
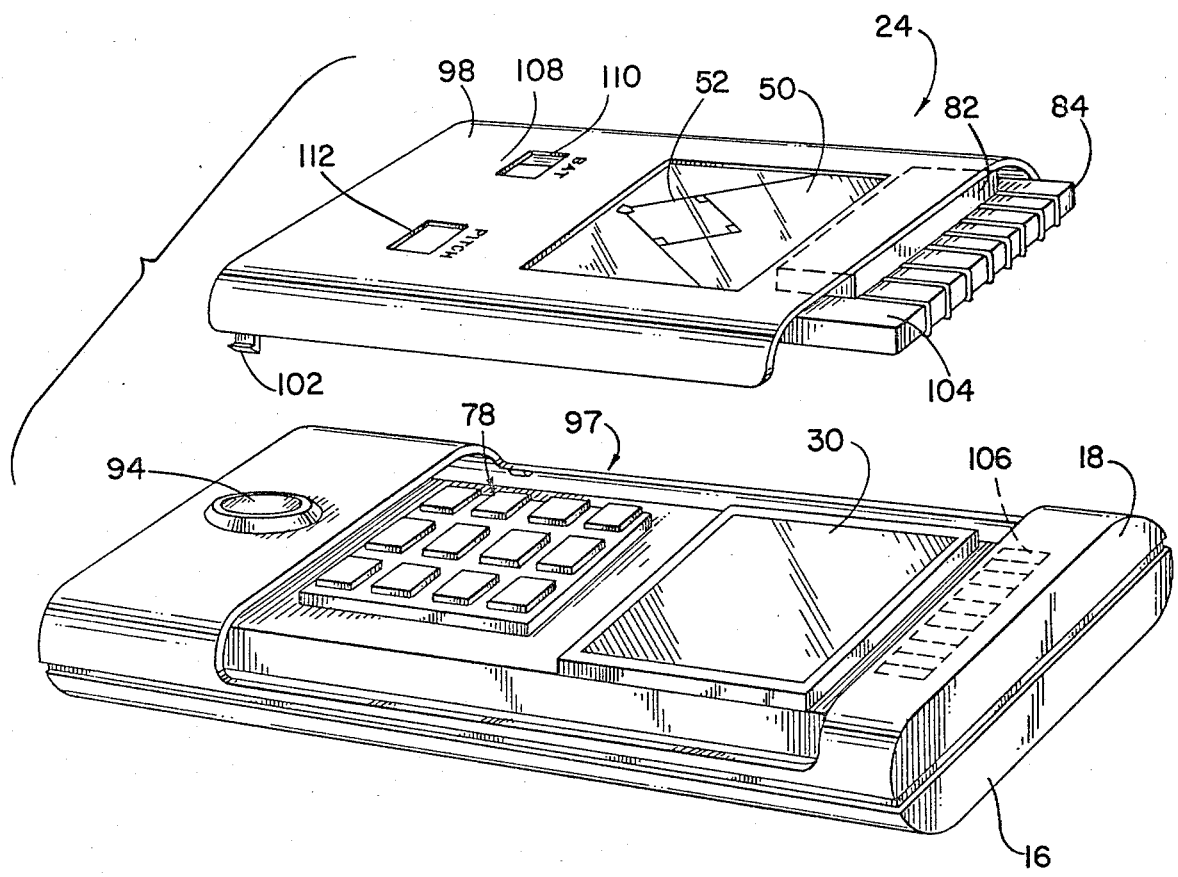
FIG. 10 is a partially exploded perspective view of a third perspective embodiment of the present invention.
Figure 11:
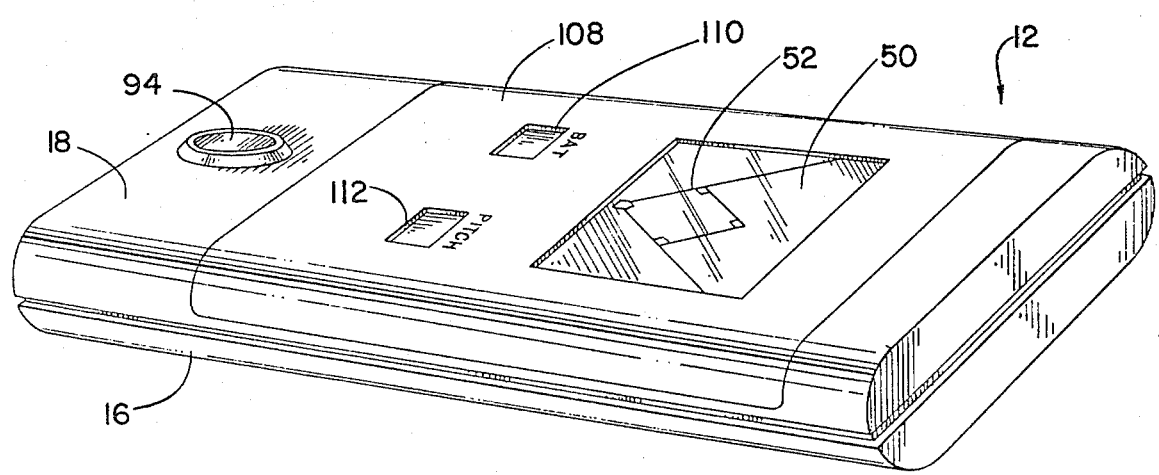
FIG. 11 is a perspective view of the third specific embodiment of the present invention.

FIGS. 10 and 11 disclose a third embodiment of the present invention wherein like figure numbers refer to the same elements described with regards to the second embodiment above. The cartridge unit 20 is provided with a template member 108 having holes 110 and 112 to permit access to the corresponding control switches 78 for playing the game. For example, one hole 110 can expose a control switch for batting while another hole 112 can expose a control switch for pitching during a simulated baseball game.

What has been described above is a novel, compact electronic game playing device having replaceable cartridges wherein each cartridge defines a different game. It will be apparent to those skilled in the art that various modifications of the present invention are possible and accordingly the scope of the present invention should be interpreted according to the following claims.

What is claimed is:

1. A compact hand holdable electrical toy game assembly adapted for enabling a person to play at least one visually simulated displayed toy game, wherein the player controls a portion of the game activity, the toy game assembly comprising:

a base unit of a size compatible with being held in an adult hand during game play;
   a flap panel information display unit contained within the base unit, the display capable of selectively displaying a plurality of symbols in the form of a visual image, and capable of interacting during the playing of the game;
   an electronics module contained within the base unit, the electronics module operatively associated with the display unit and adapted for driving the display unit;
   at least one cartridge unit having means for removably physically attaching the same across the surface of the base unit wherein it is operatively connected with the base unit to permit the game to be played, the cartridge unit having an integrated overlay that is operatively positioned over the flat panel display unit when mounted across the surface of the base unit;
   a microprocessor contained within the cartridge unit, the microprocessor having a memory defining predetermined visual symbols capable of being controllably displayed on the display unit, the memory also defining a game to be played on the display unit;
   means for operatively interconnecting the microprocessor with the electronics module, and
   control means operatively connected to the electronics module and physically attached to the base unit, the control means adapted for being selectively manipulated by a player thereby causing a predetermined response in the electronic states of the microprocessor and causing alteration in the visual image on the display unit whereby the game defined by the microprocessor is played.

2. The invention of claim 1 further comprising said overlay having a permanent graphic pattern thereon and adapted for positioning proximately to the display unit so that a variable visual symbol displayed on the display unit is viewed unitarily with the graphic pattern whereby the graphic pattern cooperates with the display unit to comprise the game.

3. The invention of claim 2 wherein the overlay is at least partially transparent and disposed over the display unit when the cartridge unit is physically attached to the base unit, whereby the variable visual symbol on the display unit is viewed through the transparent member.

4. The invention of claim 3 wherein the display unit is a liquid crystal display unit.

5. The invention of claim 4 further comprising a power source incorporated in the base unit, the power source energizing the electronic game assembly.

6. The invention of claim 1 wherein the display unit is a liquid crystal display unit.

7. The invention of claim 1 further comprising means for supporting the game assembly on a substantially solid surface.

8. The invention of claim 1 further comprising means for generating a sound effect whenever a predetermined event occurs in a game played on the game assembly.

9. A compact electronic device adapted for actualizing a program on a visual display, the device comprising:

a housing;
   a liquid crystal display unit contained within the housing;
   at least one cartridge unit capable of being removably attached to the housing;
   a microprocessor and memory unit contained within the cartridge unit, the memory unit defining a program to be activated by active participation of a person and displayed on the display unit;
   an electronic module contained within the housing and being operatively connected to the memory unit in the assembled electronic device, the electronic module including control means for bringing about predetermined responses in the memory unit, upon selective manipulation by a player, the electronic module adapted for transmitting signals from the memory unit to the display unit whereby the display unit displays visual symbols in accordance with the program objectively determined in the memory unit and subjectively determined by the player, and
   an overlay integrally included in the cartridge unit, the overlay disposed in a special relationship relative to the display unit wherein the display unit is viewed through the overlay, the overlay having a permanently affixed graphic pattern thereon whereby a visual effect of the program displayed on the display unit is further defined by the graphic pattern.

10. The invention of claim 9 comprising at least two cartridge units, each cartridge unit defining a different program.

11. The invention of claim 9 wherein the overlay is disposed over the display unit.

12. The invention of claim 9 wherein a power source suitable for energizing the device is incorporated in the housing.

13. In a compact electronic device having a flat panel electro-optical information display unit, circuitry means for driving the display unit, memory means for storing a program and microprocessor means for transmitting electric signals in response to the memory means through the circuitry means for visual display on the display unit, and manually operable control means for causing subjectively determined changes in an electronic state of the microprocessor means resulting in corresponding changes in the visual display, an improvement comprising:
   at least one cartridge unit separable from the display unit, the cartridge housing the microprocessor means; and
   an overlay incorporated in the cartridge unit, the overlay having a permanently affixed graphic symbol thereon, the overlay being positioned in the assembled device for viewing the overlay in unison with the visual display on the display unit, the control means including more than one manually operable control switch, and
   means for obscuring at least one of the control switches whereby a player is limited to activating only those switches dedicated to playing the game defined by the program.

14. The improvement of claim 13 wherein the overlay is a substantially transparent member.

15. The improvement of claim 14 wherein the overlay is disposed over the display unit whereby the display unit is viewed through the overlay.

16. The improvement of claim 15 comprising at least two cartridge units that can be removably mounted on the display unit.

17. The improvement of claim 13 wherein the means for obscuring comprises a graphic member which has at least one graphic symbol affixed thereto, the graphic symbol providing information as to the function of at least one control switch, and wherein at least one control switch is activated through the graphic member.

18. The improvement of claim 13 wherein the means for obscuring comprise a template member disposed over the control switches, the template member having at least one hole through which access is provided to at least one control switch.

19. The improvement of claim 13, further comprising means for supporting the device on a substantially solid surface.

20. The improvement of claim 13 further comprising means for generating a sound effect whenever a predetermined event occurs on the visual disply unit.

21. A compact hand-holdable electrical toy game assembly adapted for enabling a person to play at least one visually simulated displayed toy game, wherein the player controls a portion of the game activity, the toy game assembly comprising:
   a housing base unit of a size capable of being held in an adult hand during game play;
   a relatively flat information display unit contained within the housing unit, the display capable of selectively displaying symbols in the form of a visual image, that are capable of movement during the playing of the game;
   an electronics module having an appropriate driving circuit contained within the base unit, the electronics module operatively associated with the display unit and adapted for driving the display unit;
   at least one cartridge unit having means for removable physical attachment to the housing base unit wherein it is operatively connected with and across the housing base unit to enable the game assembly to play at least one predetermined game associated with the cartridge unit;
   a microprocessor contained within the cartridge unit having a memory defining predetermined visual symbols capable of being controllably displayed on the display unit, the memory also defining a game to be played on the display unit through appropriate electrical signals transmitted by the microprocessor to the driving circuit;
   means on the base unit for permitting the cartridge unit to be removably mounted across a portion of the surface of the housing base unit containing the flat display unit;
   means for electrically interconnecting the microprocessor with the electronics module, and
   control means operatively connected to the electronic module, the control melans adapted for being selectively manipulated by at least one player thereby causing a predetermined response in an electronic state of the microprocessor and causing alteration in the visual image on the display unit whereby the game defined by the microprocessor is played.

22. The invention of claim 21 further comprising an overlay included in the cartridge unit, the overlay disposed in a spatial relationship relative to the display unit wherein the display unit is viewed through the overlay, the overlay having a permanently affixed graphic pattern thereon whereby a visual effect of the program displayed on the display unit is further defined by the graphic pattern.

23. The invention of claim 22, wherein the overlay is a transparent member disposed over the display unit whereby the operating display unit is viewed through the transparent member.

24. The invention of claim 21 wherein the control means includes more than one manually operable control switch and wherein the cartridge unit further comprises means for obscuring at least one of the control switches whereby a player is prevented from activating the obscured switch.

25. The improvement of claim 24 wherein the means for obscuring comprise a template member disposed over the control switches, the template member having at least predeterminably one located hole through which access is provided to at least one control switch that corresponds to the desired game to be played with the cartridge.

26. The invention of claim 21 wherein the display unit is a liquid crystal display unit.

27. The invention of claim 21 further comprising means for generating a sound effect whenever a predetermined event occurs in a game played on the game assembly.

28. The invention of claim 21 wherein the means for attaching the cartridge unit to the housing base unit includes a protruding portion at one end and a cartridge housing panel having a peripheral configuration extending over and along the lateral sides of the housing base unit.

29. The invention of claim 28 wherein the protruding portion further contains a plurality of electrical contacts for interconnecting the microprocessor with the electronics module and the housing panel includes a pair of locking prongs.

30. The invention of claim 21 wherein the control means comprises a plurality of individual and discrete control members arranged in an array on the housing base unit and the cartridge unit includes a housing having a display panel portion adapted to extend adjacent to the visual display unit in such a spatial relationship to provide a combined visual display for playing the game and means for limiting player activation to only those discrete control members of the array that are necessary to play the specific game presented by the cartridge unit.

31. The invention of claim 30 wherein the means for limiting access includes a flexible member with indicia extending over the control members.

32. In a compact electronic device having a flat panel electro-optical information display unit, circuitry means for driving the display unit, memory means for defining a program and microprocessor means for transmitting electric signals in response to the memory means through the circuitry means for creating a visual display on the display unit, and manually operable control means for causing subjectively determined changes in an electronic state of the microprocessor means resulting in corresponding changes in the visual display, an improvement comprising:

at least one cartridge unit separable from the display unit, the cartridge housing the microprocessor means;

an overlay incorporated in the cartridge unit, the overlay being positioned in the assembled device for viewing the overlay in unison with the visual display on the display unit, the control means includes more than one manually operable control switch, and means for obscuring at least one of the control switches whereby a player is limited to activating only those switches dedicated to playing the game defined by the program.

33. The improvement of claim 32 wherein the means for obscuring comprise a template member on the cartridge unit disposed over the control switches, the template member having at least one hole through which access is provided to at least one control switch.

* * * * *